United States Patent
Snider et al.

[11] Patent Number: 5,821,820
[45] Date of Patent: Oct. 13, 1998

[54] DUAL BAND VOLTAGE CONTROLLED OSCILLATOR

[75] Inventors: James R. Snider, Elk Grove Village; Glen O. Reeser, Palatine, both of Ill.

[73] Assignee: Motorola Inc., Schaumburg, Ill.

[21] Appl. No.: 950,874

[22] Filed: Aug. 15, 1997

[51] Int. Cl.⁶ .............................. H03B 5/12; H03B 5/18
[52] U.S. Cl. .............................. 331/48; 331/49; 331/60; 331/117 R; 331/117 D; 331/115; 331/117 V; 331/179
[58] Field of Search .................. 331/48, 49, 60, 331/117 R, 117 D, 117 V, 179, 115

[56] References Cited

U.S. PATENT DOCUMENTS

| | | | |
|---|---|---|---|
| 4,485,355 | 11/1984 | Scott | 331/179 |
| 5,250,910 | 10/1993 | Yabuki et al. | 331/60 |
| 5,418,497 | 5/1995 | Martin | 331/48 |
| 5,535,432 | 7/1996 | Dent | 455/77 |

OTHER PUBLICATIONS

"RF Chip Set Provides Multiband Cellular/PCS Solutions," Author Unknown Published: Wireless System Design Issue: Jan. 1997, p. 62.

*Primary Examiner*—Siegfried H. Grimm
*Attorney, Agent, or Firm*—Brian M. Mancini; Gary J. Cunningham

[57] ABSTRACT

A voltage controlled oscillator operable on two widely separated frequency bands, such as 900 MHz and 1.8 GHz for example. The voltage controlled oscillator includes two negative resistance generators (32, 34) which share a common tunable tank circuit (26) and a common impedance matched combiner circuit (28) which provides the RF output (36). The VCO uses only one varactor (30) to tune both frequency bands. Separate negative resistance generators (32, 34) are used to provide optimum frequency selectivity within each frequency band.

20 Claims, 5 Drawing Sheets

DUAL BAND VOLTAGE CONTROLLED OSCILLATOR

FIELD OF THE INVENTION

The present invention relates generally to voltage controlled oscillators used in frequency synthesizers in communication devices and, in particular, to a dual band voltage controlled oscillator.

BACKGROUND OF THE INVENTION

New frequency spectrum allocations for personal communications have created a need for portable telephones which operate both in the existing 900 MHz frequency band as well as the newly allocated 1.8 GHz frequency band. Therefore, local oscillators for these dual band portable telephones are required to operate in two widely separated frequency ranges.

Prior art dual band devices have included; completely separate local oscillators with combiner networks, local oscillators with doublers or triplers to multiply the frequency, pin diodes or other similar RF switching devices, and extremely wide band oscillators having an operable frequency range that overlaps the two bands of interest.

The disadvantage of using completely separate local oscillators with combiner networks is that two complete sets of VCO circuitry are required in addition to the combiner network circuitry. This requires the use of two tuning elements, such as varactors, which adds cost and size to the overall circuit.

The disadvantage of using local oscillators with doublers or triplers to multiply the frequency is that spurious signals are always present in the output. These spurious signals must be filtered out to avoid degrading receiver performance or interference with other radio services. In addition, the parts count increases greatly with doublers and triplers and the desired output frequencies must exactly match those multiples. Moreover, phase noise increases with frequency doubling or tripling.

The disadvantage of pin diodes is that pin diodes require significant DC current to obtain a low "on" impedance, and when the pin diodes are "off" they can create high levels of harmonically related spurious signals. Moreover, tank circuits associated with the pin diodes reduce circuit Q, which reduces efficiency, and causes higher phase noise in the output circuit.

The disadvantage of using extremely wide band oscillators is that wideband oscillators are necessarily very sensitive to tuning control. This sensitivity makes the oscillator more susceptible to noise on the tuning control line. Correspondingly, more sensitive tuning requires tighter coupling to the tuning element (varactor) of the oscillator which causes higher losses in the associated tank circuit.

There is a need for a voltage controlled oscillator that: can generate different frequencies that are not necessarily multiples of each other and that uses only one tuning element. In addition there is a need for a voltage controlled oscillator that does not require pin diodes and is not sensitive to noise on a tuning control. It is also desired to have a voltage controlled oscillator that: exhibits a good frequency stability, minimizes spurious frequency signals, has low losses and current drain, and requires simpler, and therefore less costly, circuitry.

DETAILED DESCRIPTION OF THE PREFERRED EMBODIMENT

The present invention is a multi-frequency voltage controlled oscillator with two or more frequency modes of operation. The frequency modes can be of any frequency and are not necessarily multiples of each other. A band of frequency operation is selected by changing a bias voltage on one or more of a plurality of transistor/feedback blocks used as negative resistance generators in oscillator loops. The transistors are commonly DC coupled at their collectors. A base circuit of each transistor is coupled to a single resonant tuning circuit. Preferably, one tuning element, such as a varactor, is included in the tuning circuit to provide frequency tuning.

Advantageously, the present invention provides multiple frequencies using only one tuning element without any pin diodes which can cause noise problems. The simple design of the present invention exhibits good frequency stability with minimal spurious frequency signals. In addition the simple design is less costly and draws less current than prior art designs.

Figure 1:
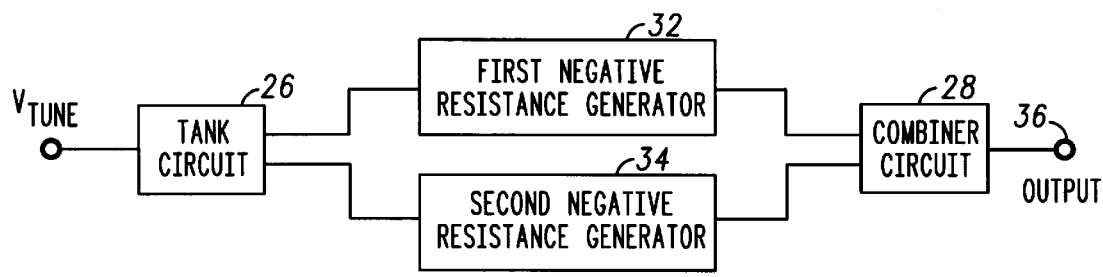
FIG. 1 is a block diagram of a first embodiment of a voltage controlled oscillator, in accordance with the present invention.

FIG. 1 shows a first embodiment of the present invention describing a multi-band tunable frequency source such as a dual-band voltage controlled oscillator (VCO). The frequency source includes a tank circuit 26 responsive to a tuning voltage, $V_{TUNE}$. The tank circuit 26 has an output coupled to both inputs of a first and second negative resistance generator 32, 34. The first negative resistance generator 32 is operable at a first frequency and the second negative resistance generator 34 is operable at a second frequency. The outputs of the first and second negative resistance generators are combined into two inputs of a combiner circuit 28. An output 36 of the combiner circuit 28 provides the multiband RF output signal of the VCO. The output 36 is subsequently used as an RF feedback signal or locked loop signal, such as in a phase locked loop, a frequency locked loop, or a delay locked loop. Preferably, the combiner circuit 28 includes an output matching network which impedance matches the outputs of both the first and second negative resistance generators 32, 34 at their respective first and second frequencies.

Figure 2:
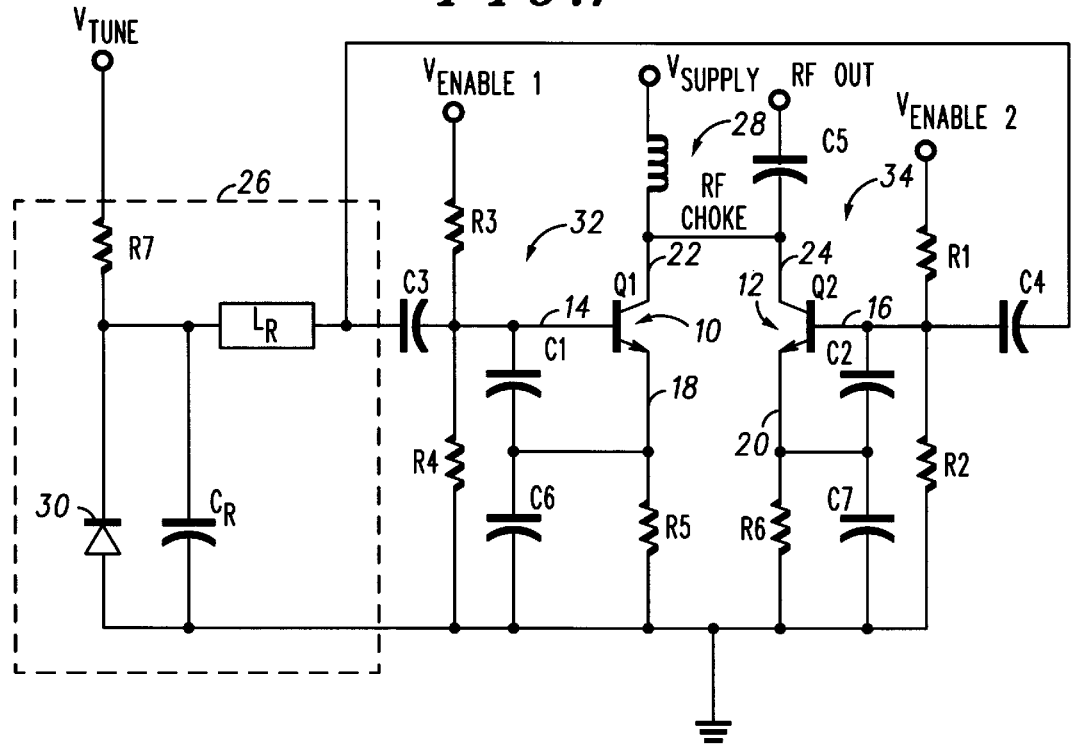
FIG. 2 is a simplified schematic diagram of the voltage controlled oscillator of FIG. 1.

FIG. 2 shows a simplified schematic diagram of the first embodiment of FIG. 1, and includes a first and a second transistor (Q1 and Q2) 10, 12 each having respective bases 14, 16, emitters 18, 20, and collectors 22, 24. The collectors 22, 24 of the transistors 10, 12 are commonly AC and DC coupled. The first and second bases 14, 16 are coupled to a resonant tank circuit 26 which includes a single varactor 30 that resonates with a first inductor, $L_R$. Preferably, the inductor, $L_R$, is a stripline (transmission line). Optionally, a capacitor, $C_R$, can be connected in parallel with the varactor 30 to provide a desired tuning sensitivity. The varactor 30 is responsive to a tuning signal, $V_{TUNE}$, via an isolation resistor, R7, as shown in FIG. 2. $V_{TUNE}$ tunes the resonant circuit within its operable predetermined frequency band. This is particularly useful in radio communication devices using frequency synthesizers that change channels within a frequency band during operation.

In particular, the configuration of FIG. 2 includes two transistors Q1 and Q2 with commonly connected collectors. A base 16 of transistor Q2 is AC coupled to the tank circuit 26 through a DC blocking capacitor C4 having a value of about 100 pf. The resonator contains an LC circuit, tuned stub, or stripline preferably. The resonator is shown as an equivalent LC network, $L_R$ and $C_R$. The actual component values can vary as long as the LC network resonates at or near the desired frequency band. The resonator also includes a voltage variable reactance element such as a varactor 30 which, during operation of the oscillator, is used to tune the resonator to particular frequency channels within the operable frequency band. The varactor 30 is tuned by a tuning signal, $V_{TUNE}$, coupled to the varactor 30 via an isolation resistor, R7, or alternatively an RF choke. The varactor 30 is connected in series with the first inductor, $L_R$. The first inductor, $L_R$, is capacitively coupled in series to the inputs of the negative resistance generators 32, 34. The base of transistor Q2 is constantly biased through a resistive transistor biasing network, R1 and R2. A feedback loop including a capacitor, C2, is connected across the base and emitter of Q2. Another feedback loop capacitor, C7, is connected from the emitter connection to ground. Resistor R6 is used as an all-frequency choke to the supply, and is connected between the emitter connection and ground.

A base 14 of transistor Q1 is AC coupled to the tank circuit 26 through a DC blocking capacitor, C3. A feedback loop capacitor, C1, is connected across the base 14 and emitter 18 of Q1. The base 14 of transistor Q1 is biased through a resistive transistor biasing network, R3 and R4. The collectors 22, 24 of Q1 and Q2 are commonly AC and DC coupled and provide a single RF output 36 via a DC blocking capacitor, C5. It should be recognized that the actual values of the above components can be selected to accommodate a desired frequency band using techniques that are known in the art.

The operating frequency band of the voltage controlled oscillator is determined by $V_{ENABLE1}$ and $V_{ENABLE2}$ which control their respective biasing networks, R3/R4 and R1/R2 and the relative base bias voltages of the transistors. When $V_{ENABLE1}$ turns Q1 on (Q2 is off), the first negative resistance generator 32 is coupled to the tank circuit 26 causing an RF output 36 at a first operating frequency band. When $V_{ENABLE2}$ turns Q2 on (Q1 is off), the second negative resistance generator 34 is coupled to the tank circuit 26 causing an RF output 36 at a second operating frequency band.

In the first embodiment of the present invention, as shown in FIG. 2, the collectors 22, 24 of the transistors 10, 12 are commonly electrically connected such that a single VCO RF output 36 is provided which is operable within one or the other of the first and second frequency bands. The tuning arrangement includes the varactor element 30 being coupled with respective negative resistance generators 32, 34 and being tuned with a single tuning signal ($V_{TUNE}$) input. The oscillator shown is of a Colpitts configuration. However, this is not a requirement of the invention, and the oscillator may be of other oscillator configurations including, but not limited to, Clapp, Driscoll, Butler, Pierce, and Hartley.

The novel configuration of the transistors and VCO advantageously: can generate widely frequencies without using a wideband oscillator design, operates on only one frequency at a time to save power, does not require completely separate oscillator circuits to obtain different frequencies, does not require pin diodes, has narrow band operation within either of two widely spaced frequency bands, is less sensitive to noise on the tuning signal, exhibits a good frequency stability, has minimized spurious frequency generation, has low losses and current drain, and uses simpler, and therefore less costly, circuitry.

Figure 3:
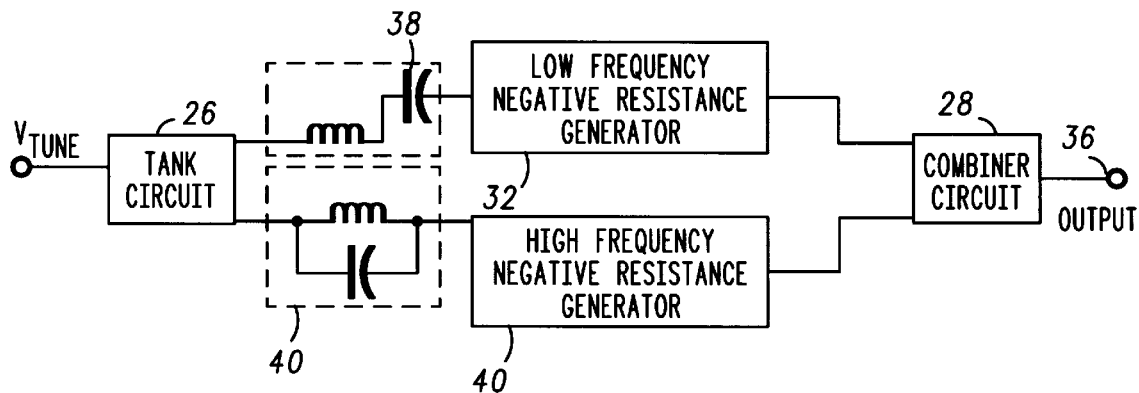
FIG. 3 is a block diagram of a second embodiment of a voltage controlled oscillator, in accordance with the present invention.

Optionally, frequency selective circuitry can be coupled between the output of the tank circuit and the associated inputs of each negative resistance generator, as shown in FIG. 3, to further improve frequency selectivity. In particular, a low frequency series resonant circuit 38 is connected between the tank circuit 26 and the first negative resistance generator 32 being operable at a low frequency such as 900 MHz, and a high frequency parallel resonant circuit 40 is connected between the tank circuit 26 and the second negative resistance generator 34 being operable at a high frequency such as 1800 MHz. The outputs from both negative resistance generators are coupled to the output 36 via the combiner circuit 28 as was done in the previous examples. Alternatively, the frequency selective circuitry can be replaced or augmented by respective lowpass and highpass filters associated with the low frequency and high frequency negative resistance generators.

Figure 4:
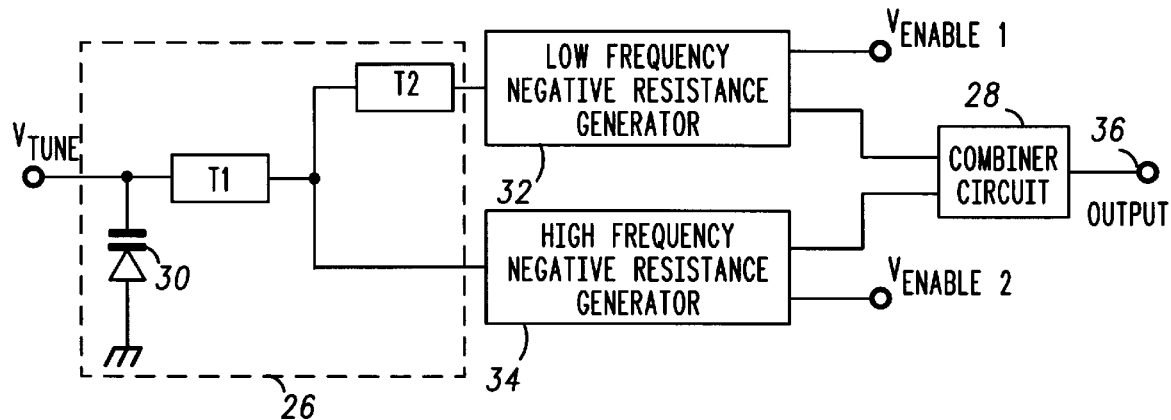
FIG. 4 is a simplified schematic diagram of a preferred embodiment of a voltage controlled oscillator, in accordance with the present invention.

FIG. 4 shows a preferred embodiment of the present invention, wherein the voltage controlled oscillator is substantially the same as in the first embodiment, but includes a second series inductor coupled between the first series inductor and the first negative resistance generator 32. Preferably, the first and second series inductors in the tank circuit are transmission lines, T1 and T2, as shown. The reference numbers and labels used for FIGS. 1 and 2 are commensurate with the numbers and labels of FIG. 4 which are hereby incorporated by reference. Transmission line T1 replaces inductor $L_R$ of FIG. 2, and transmission line T2 has been coupled in the signal path to the low frequency negative resistance generator 32. The negative resistance generators 32, 34 and combiner circuit 28 and output 36 are the same as presented previously.

In operation, either the first or second (low or high frequency) negative resistance generator 32, 34 is enabled, but not both. $V_{ENABLE1}$ is used to enable the operation of the low frequency negative resistance generator 32 and $V_{ENABLE2}$ is used to enable the operation of the high frequency negative resistance generator 34. When the first (low frequency) negative resistance generator 32 is enabled the equivalent circuit appears as in FIG. 5 where a first (low)

frequency is generated at the RF output 36, and a parasitic capacitance 42, due to the connection to the inactive second (high frequency) negative resistance generator 34, is coupled in shunt between transmission lines, T1 and T2. When the second (high frequency) negative resistance generator 34 is enabled the equivalent circuit appears as in FIG. 6 where a second (high) frequency is generated at the RF output 36, and a parasitic capacitance 44, due to the connection to the inactive first (low frequency) negative resistance generator 34, is coupled in series with transmission lines, T2, to ground.

Figure 5:
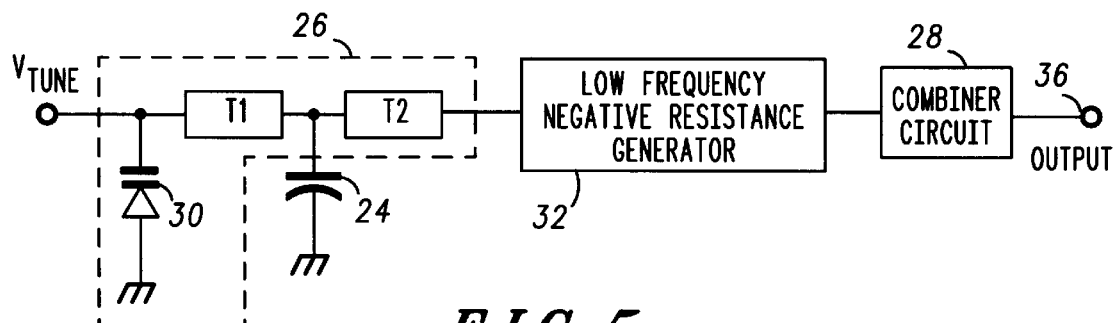
FIG. 5 is a simplified schematic diagram of the voltage controlled oscillator of FIG. 4 operating on a first frequency band.
Figure 6:
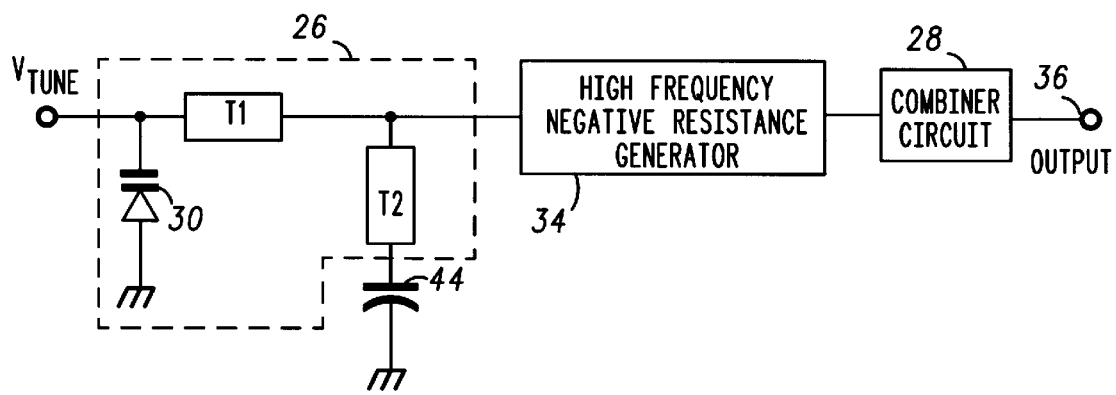
FIG. 6 is a simplified schematic diagram of the voltage controlled oscillator of FIG. 4 operating on a second frequency band.

In particular, transmission line T2 is designed to resonate out the parasitic capacitance 44, as shown in FIG. 6, during high frequency operation. Transmission line T1 and the varactor are then designed, using techniques known in the art, to resonate at the desired high frequency, such as 1800 MHz for example. In practice, the second series inductor (transmission line T2) is about $\lambda/4$ in wavelength at the second operating (high) frequency of the second negative resistance generator, and is adjusted in length to tune out the parasitic capacitance 44. Transmission line T2 is adjusted specifically for the high frequency operation of the VCO as the high frequency operation is the most sensitive to being loaded down by capacitance. Surprisingly, during low frequency operation such as 900 MHz for example, as shown in FIG. 5, transmission line T2 has an equivalent length of about $\lambda/8$ and, along with the parasitic capacitance 42, supports the resonant low frequency mode. Furthermore, it is not a necessary condition in the present invention that the lower frequency be exactly one-half of the higher frequency. However, it is preferred that the ratio of the frequencies be relatively near to 1:2.

The above embodiments of the dual mode voltage controlled oscillator have particular distinctive features. First, sharing of a tank circuit between different operating frequency modes would be expected to load down either one or the other mode. The present invention avoids this problem as demonstrated above. Second, duplexing the tank circuit to the different negative resistance generators would degrade the Q of the circuit unacceptably. The present invention avoids this problem. Third, providing a straight impedance match for each operating mode would require many additional components, which the present invention avoids. Fourth, the present invention uses parasitic capacitances to an advantage, instead of trying to remove all parasitics as is attempted in the prior art. Fifth, all diodes are eliminated from the circuit which improves Q and phase noise. Lastly, one varactor is used for tuning both bands which reduces cost and size.

Figure 7:
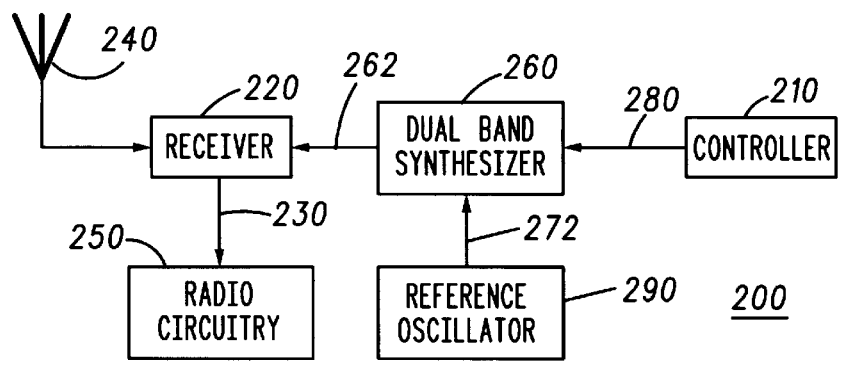
FIG. 7 is a simplified block diagram of a radio incorporating a dual frequency voltage controlled oscillator, in accordance with the present invention.

FIG. 7 shows a block diagram of a communication device 200 which includes a frequency synthesizer 260 which contains a multi-band frequency source, in accordance with the present invention. The communication device can be a transmitter, transceiver, or a receiver. In one embodiment, the communication device 200 comprises a frequency synthesized receiver which provides an output 230 to associated radio circuitry 250. The communication device 200 includes a receiver 220 which receives RF signals via an antenna 240 of a preferably dual-mode design. The receiver 220 can be controlled by the controller 210 in either digital or analog communication applications. A reference oscillator 290 provides a reference oscillator signal 272 for the synthesizer 260. The synthesizer 260 provides a receiver local oscillator signal 262, which is controlled by the multi-band frequency source of the present invention, to the receiver 220. The multi-band tunable frequency source of the frequency synthesizer 260 is operable on at least two frequency bands, utilizing the principles of the present invention, controlled by a band enable signal 280 from the controller 210.

In another embodiment, the communication device is a transceiver such as in a cellular phone. The synthesizer provides an additional transmitter local oscillator signal controlled by the multi-band frequency source. The multi-band tunable frequency source of the frequency synthesizer is operable on two frequency bands, as described above. The transmitter and receiver are switchably connected to the antenna under control of the controller.

Figure 8:
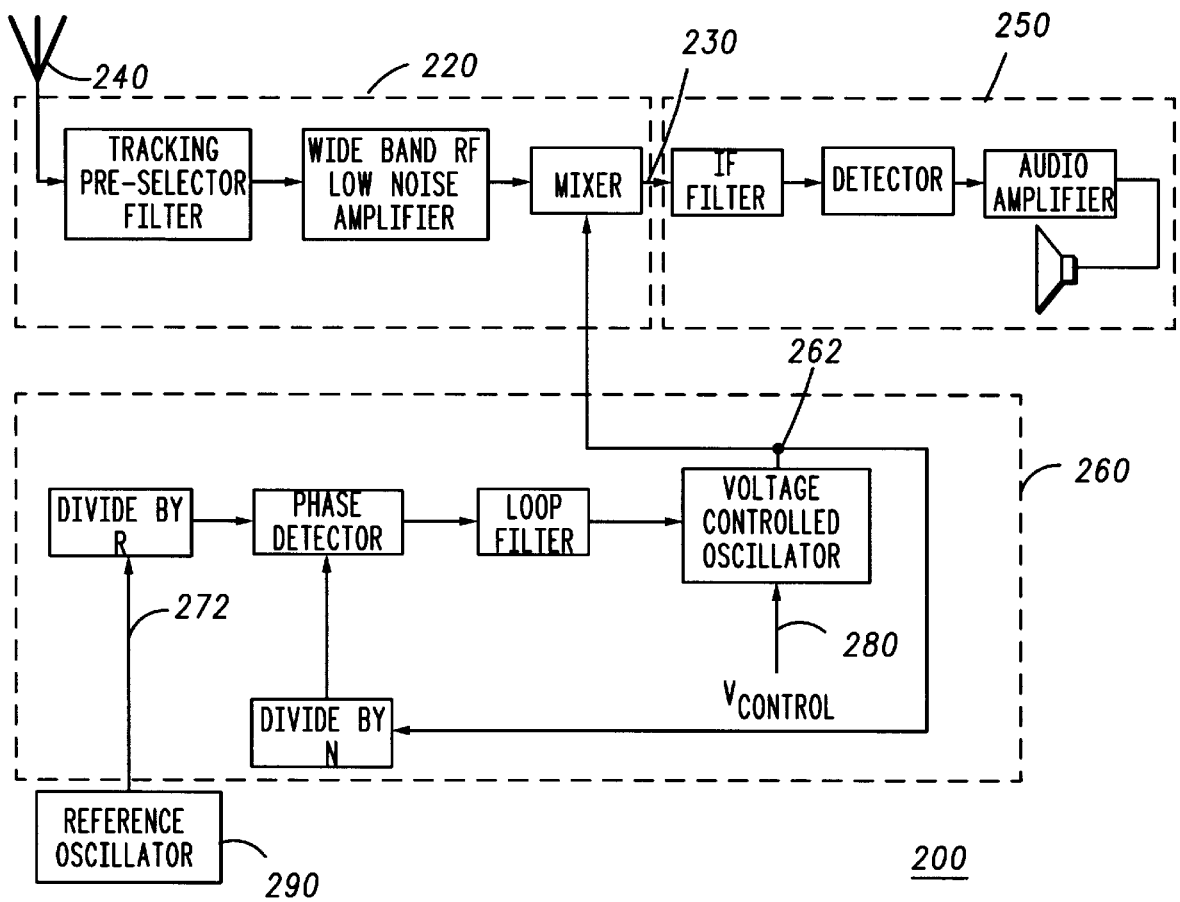
FIG. 8 is a block diagram of the radio of FIG. 7.

FIG. 8 shows the radio of FIG. 7 utilizing the single output, dual band frequency source of FIGS. 1–6. The radio includes an antenna 240 coupled to a receiver 220 which provides an output 230 to associated radio circuitry 250, a reference oscillator coupled to a dual band frequency synthesizer controlled by a band enable signal 280 and incorporating the VCO of the present invention and feeding a local oscillator signal 262 to the receiver 220.

The radio receiver 220 includes a tracking pre-selector filter which selectively passes desired frequency bands; 900 MHz and 1.8 GHz, for example. The pre-selector feeds a filtered signal to a wideband RF amplifier. Preferably, the amplifier is of a low noise design that can amplify 900 MHz and 1.8 GHz signals for example. The amplifier provides an amplified signal to a mixer. The frequency synthesizer provides one of two frequency band signals to the mixer. The frequency band provided is responsive to a band enable signal 280. The mixer provides a mixed down IF output 230 to associated radio circuitry 250.

The associated radio circuitry 250 can contain an IF filter, detector, audio amplifier, and transducer, for example. The IF filter selects the correct IF output from the multiple frequency products produced by the mixer. The correct IF output is converted to an audio signal in the detector, which is subsequently amplified and transduced by a speaker into an audio signal, for example.

The frequency synthesizer 260 includes the VCO of the present invention which provides a feedback signal from the local oscillator signal 262 to a phase detector via a first divider. The reference oscillator 290 also provides a reference signal to the phase detector via a second divider. The phase detector provides a correction signal to the VCO via a low pass loop filter, which removes high frequency artifacts. The correction signal is proportional to the phase difference between inputs to the phase detector which is known in the art as a phase locked loop. The present invention advantageously uses a dual band VCO, without changing any other components of the phase locked loop, to provide two widely dissimilar frequencies tunable over a narrow range.

Example

Referring to FIGS. 2 and 4, a dual band voltage controlled oscillator was modeled with Hewlett Packard's MDS™ software using the following capacitive and inductive elements, in accordance with a preferred embodiment of the present invention. However, it should be recognized that the chosen values of the components can be changed to accommodate a desired frequency band using techniques that are known in the art.

| | |
|---|---|
| R1 = 470 ohm | R2 = 3300 ohm |
| R3 = 1000 ohm | R4 = 3300 ohm |
| R5 = 10 ohm | R6 = 33 ohm |
| R7 = 10 kohm | |
| C1 = 6.2 pf | C2 = 10 pf |

-continued

| | |
|---|---|
| C3 = 22 pf | C4 = 100 pf |
| C5 = 100 pf | C6 = 6.8 pf |
| C7 = 12 pf | $C_R$ = 2 pf |
| Q1 and Q2 - Motorola MRF571 | |
| T1 = stripline designed to provide 900 MHz output, or equivalent to about 5.9 nH. | |
| T2 = stripline designed to provide 1.8 GHz output, or equivalent to about 2.4 nH. | |

Figure 9:
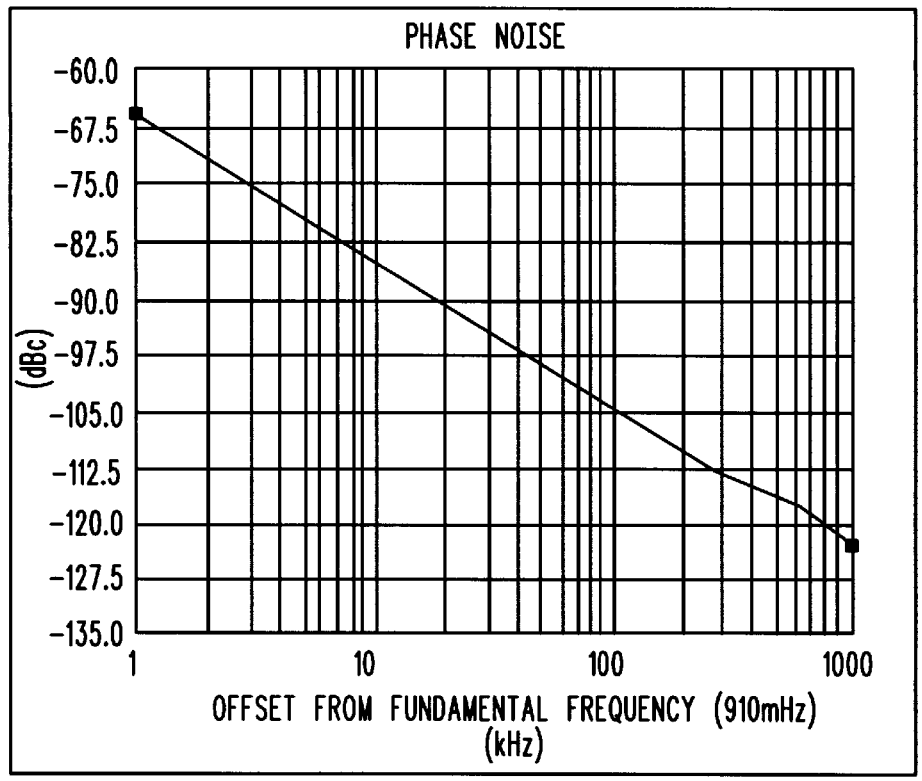
FIG. 9 is a graphical representation of low frequency phase noise of the voltage controlled oscillator of FIG. 2.
Figure 10:
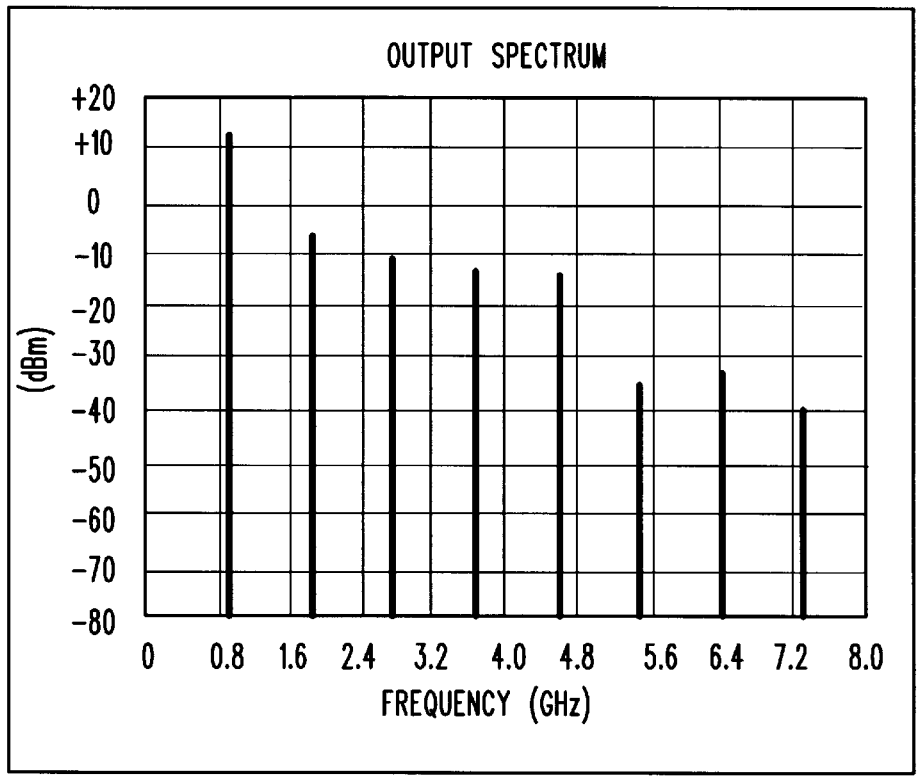
FIG. 10 is a graphical representation of low frequency output spectrum of the voltage controlled oscillator of FIG. 2.
Figure 11:
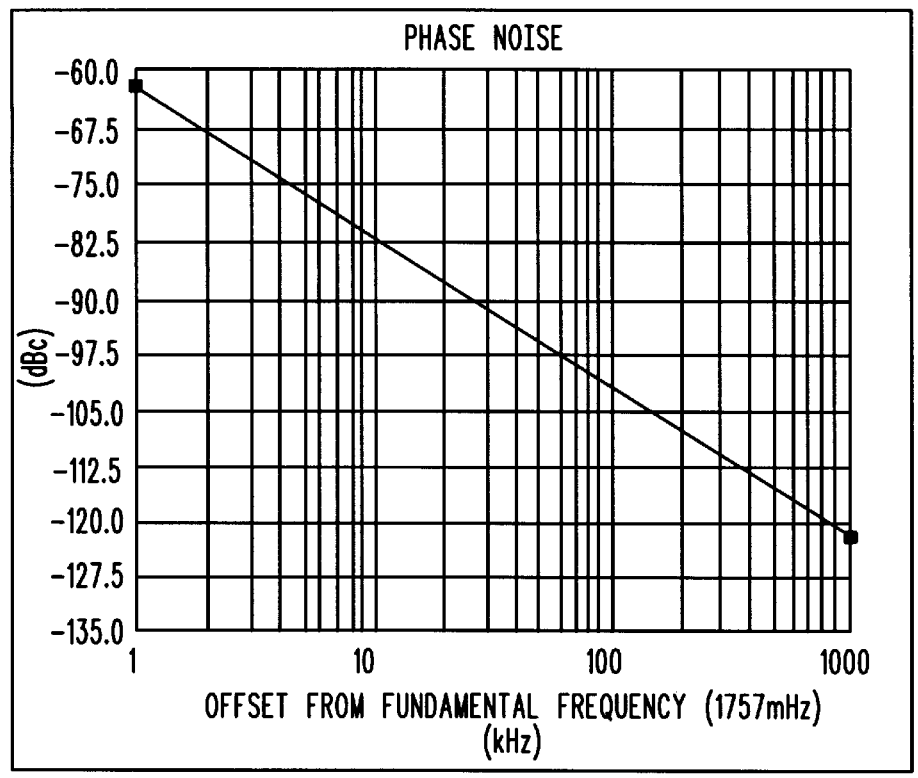
FIG. 11 is a graphical representation of high frequency phase noise of the voltage controlled oscillator of FIG. 2.
Figure 12:
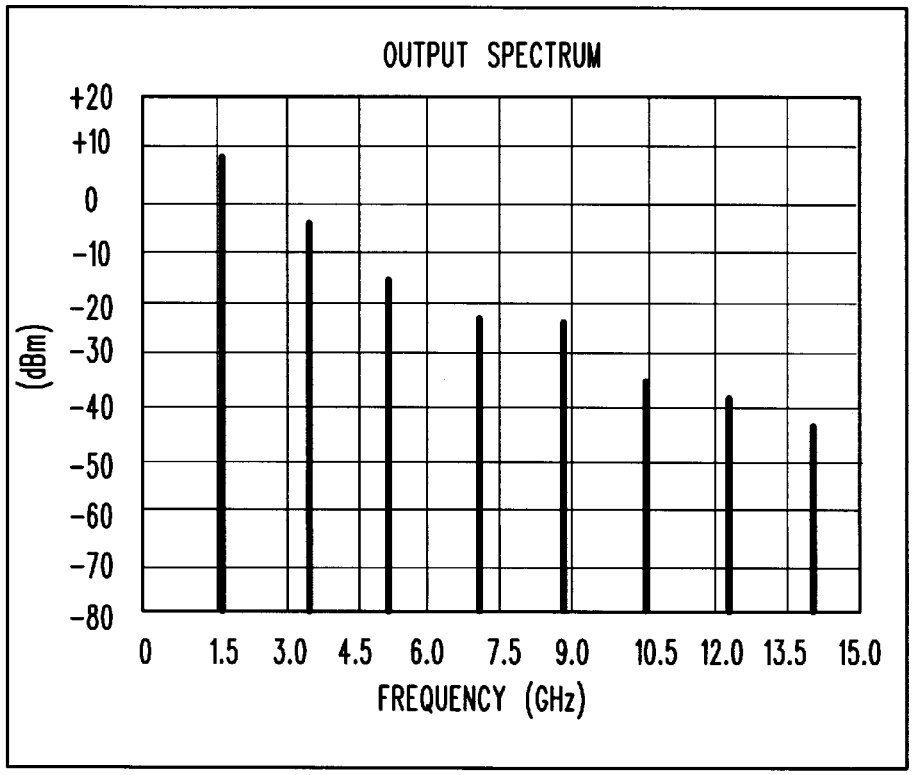
FIG. 12 is a graphical representation of high frequency output spectrum of the voltage controlled oscillator of FIG. 2.

For this configuration $V_{ENABLE1}$ and $V_{ENABLE2}$ were switched between ground (low) and $V_{SUPPLY}$ (high). When $V_{ENABLE1}$ was held low and $V_{ENABLE2}$ was held high, a frequency signal of about 1.8 GHz was obtained from RF output 36. The resultant phase noise plot is shown in FIG. 9, and the output spectrum is presented in FIG. 10. When $V_{ENABLE1}$ was held high and $V_{ENABLE2}$ was held low, a frequency signal of about 900 MHz was obtained from RF output 36. The resultant phase noise plot is shown in FIG. 11, and the output spectrum is presented in FIG. 12.

Although various embodiments of this invention have been shown and described, it should be understood that various modifications and substitutions, as well as rearrangements and combinations of the preceding embodiments, can be made by those skilled in the art, without departing from the novel spirit and scope of this invention.

What is claimed is:

1. A multi-band tunable frequency source, comprising:
   a tank circuit responsive to a tuning voltage, the tank circuit having an output;
   a first negative resistance generator operable at a first frequency and having an input and an output and a second negative resistance generator operable at a second frequency and having an input and an output, the output of the tank circuit being coupled to the inputs of the negative resistance generators; and
   a combiner circuit having a first and second input and an output, the first and second inputs of the combiner circuit coupled to the respective outputs of the first and second negative resistance generators.

2. The multi-band tunable frequency source of claim 1, wherein the tank circuit includes a single varactor for tuning both the first and second frequencies.

3. The multi-band tunable frequency source of claim 1, wherein each negative resistance generator includes a transistor with a feedback loop and a transistor biasing network, the transistor is operably switched on and off via an associated control signal applied to the biasing network.

4. The multi-band tunable frequency source of claim 1, wherein the tank circuit includes a shunt varactor coupled to a first series inductor, the first series inductor capacitively coupled to the inputs of the negative resistance generators, the shunt varactor providing a varying capacitance responsive to the tuning voltage such that the operable frequencies of the negative resistance generators are tunable.

5. The multi-band tunable frequency source of claim 4, wherein the tank circuit includes a second series inductor coupled between the first series inductor and the input of the first negative resistance generator.

6. The multi-band tunable frequency source of claim 5, wherein the second series inductor is a transmission line of approximately one-quarter wavelength of the second frequency of the second negative resistance generator.

7. The multi-band tunable frequency source of claim 6, wherein each negative resistance generator includes a transistor with a feedback loop and a transistor biasing network, the transistor being operably switched on and off via an associated control signal applied to the biasing network, and wherein:

when the first negative resistance generator is switched off and the second negative resistance generator is switched on, so as to operate the frequency source at a higher second frequency, a parasitic capacitance due to the feedback loop of the first negative resistance generator and connected in series with the second series inductor is tuned out by the second series inductor, which exhibits approximately one-quarter wavelength at the second frequency, such that the tank circuit resonates the second negative resistance generator substantially with only the shunt varactor and the first series inductor; and when the second negative resistance generator is switched off and the first negative resistance generator is switched on, so as to operate the frequency source at a lower first frequency, a parasitic capacitance due to the feedback loop of the second negative resistance generator and connected in shunt with the second series inductor, which exhibits approximately one-eighth wavelength at the first frequency, is used in the tank circuit to resonate the first negative resistance generator with the shunt varactor, first series inductor, shunt parasitic capacitance and second series inductor.

8. The multi-band tunable frequency source of claim 1, wherein a frequency selective circuit is connected between the output of the tank circuit and the associated input of each negative resistance generator, respectively.

9. The multi-band tunable frequency source of claim 8, wherein the frequency selective circuit connected to a lower frequency negative resistance generator is a series resonant circuit at the lower frequency and the frequency selective circuit connected to a higher frequency negative resistance generator is a parallel resonant circuit at the higher frequency.

10. The multi-band tunable frequency source of claim 1, wherein the combiner circuit includes an output matching network which impedance matches the outputs of both the first and second negative resistance generators at their respective first and second frequencies.

11. A tunable dual frequency band voltage controlled oscillator, comprising:
    a tank circuit responsive to a tuning voltage, the tank circuit including a shunt varactor coupled to a first series inductor which is coupled to an output, the shunt varactor providing a varying capacitance responsive to the tuning voltage and for tuning an operable frequency within the dual frequency bands;
    a first and a second negative resistance generator operable at a respective first and second frequency and having respective inputs and outputs, each negative resistance generator includes a transistor with a feedback loop and a transistor biasing network, the transistor is operably switched on and off via an associated control signal applied to the biasing network, the output of the tank circuit being coupled to the inputs of the negative resistance generators such that the operable frequencies of the negative resistance generators are tunable; and
    a combiner circuit having a first and second input and an output, the first and second inputs of the combiner circuit coupled to the respective outputs of the first and second negative resistance generators, the combiner circuit including an output matching network which impedance matches the outputs of both the first and second negative resistance generators at their respective first and second frequencies.

12. The tunable dual frequency band voltage controlled oscillator of claim 11, wherein the input of each negative resistance generator is connected to a base of the associated transistor and an output of each negative resistance generator is connected to a collector of the associated transistor, the feedback loop being coupled between the base and emitter of the transistor, and the biasing network being coupled to the base of the transistor.

13. The tunable dual frequency band voltage controlled oscillator of claim 11, wherein a frequency selective circuit is connected between the output of the tank circuit and the associated input of each negative resistance generator, respectively.

14. The tunable dual frequency band voltage controlled oscillator of claim 13, wherein the frequency selective circuit connected to a lower frequency negative resistance generator is a series resonant circuit at the lower frequency and the frequency selective circuit connected to a higher frequency negative resistance generator is a parallel resonant circuit at the higher frequency.

15. The tunable dual frequency band voltage controlled oscillator of claim 11, wherein the tank circuit includes a second series inductor coupled between the first series inductor and the input of the first negative resistance generator.

16. The tunable dual frequency band voltage controlled oscillator of claim 15, wherein the second series inductor is a transmission line of approximately one-quarter wavelength of the second frequency of the second negative resistance generator.

17. The tunable dual frequency band voltage controlled oscillator of claim 16, wherein the first frequency is about one-half that of the second frequency, and wherein:

when the first negative resistance generator is switched off and the second negative resistance generator is switched on, so as to operate the voltage controlled oscillator at the higher second frequency, a parasitic capacitance due to the feedback loop of the first negative resistance generator and connected in series with the second series inductor is tuned out by the second series inductor, which exhibits approximately one-quarter wavelength at the second frequency, such that the tank circuit resonates the second negative resistance generator substantially with only the shunt varactor and the first series inductor; and when the second negative resistance generator is switched off and the first negative resistance generator is switched on, so as to operate the voltage controlled oscillator at the lower first frequency, a parasitic capacitance due to the feedback loop of the second negative resistance generator and connected in shunt with the second series inductor, which exhibits approximately one-eight wavelength at the first frequency, is used in the tank circuit to resonate the first negative resistance generator with the shunt varactor, first series inductor, shunt parasitic capacitance and second series inductor.

18. A dual band radio communication device having a receiver and including a multi-band tunable frequency source, comprising:

a tank circuit responsive to a tuning voltage, the tank circuit having an output;

a first negative resistance generator operable at a first frequency and having an input and an output and a second negative resistance generator operable at a second frequency and having an input and an output, the output of the tank circuit being coupled to the inputs of the negative resistance generators; and a combiner circuit having a first and second input and an output, the first and second inputs of the combiner circuit coupled to the respective outputs of the first and second negative resistance generators.

19. The dual band radio communication device of claim 18, wherein the tank circuit includes a shunt varactor and a first and second series inductor, the second series inductor coupled between the first series inductor and the input of the first negative resistance generator, the second series inductor being a transmission line of approximately one-quarter wavelength of the second frequency of the second negative resistance generator.

20. The dual band radio communication device of claim 19, wherein each negative resistance generator includes a transistor with a feedback loop and a transistor biasing network, the transistor being operably switched on and off via an associated control signal applied to the biasing network, and wherein:

when the first negative resistance generator is switched off and the second negative resistance generator is switched on, so as to operate the frequency source at a higher second frequency, a parasitic capacitance due to the feedback loop of the first negative resistance generator and connected in series with the second series inductor is tuned out by the second series inductor, which exhibits approximately one quarter wavelength at the second frequency, such that the tank circuit resonates the second negative resistance generator substantially with only the shunt varactor and the first series inductor; and when the second negative resistance generator is switched off and the first negative resistance generator is switched on, so as to operate the frequency source at a lower first frequency, a parasitic capacitance due to the feedback loop of the second negative resistance generator and connected in shunt with the second series inductor, which exhibits approximately one-eighth wavelength at the first frequency, is used in the tank circuit to resonate the first negative resistance generator with the shunt varactor, first series inductor, shunt parasitic capacitance and second series inductor.

* * * * *